US008085552B2

(12) United States Patent
Takao

(10) Patent No.: US 8,085,552 B2
(45) Date of Patent: Dec. 27, 2011

(54) ATTACHMENT DEVICE AND ELECTRONIC APPARATUS

(75) Inventor: Kazuaki Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/642,982

(22) Filed: Dec. 21, 2009

(65) Prior Publication Data

US 2010/0165592 A1 Jul. 1, 2010

(30) Foreign Application Priority Data

Dec. 26, 2008 (JP) .................................. 2008-333593

(51) Int. Cl.
*H05K 7/02* (2006.01)
*H05K 7/04* (2006.01)
(52) U.S. Cl. ........................................ 361/807; 361/810
(58) Field of Classification Search .................. 361/807, 361/810, 756, 727, 737, 760, 736, 720, 748, 361/801–803; 439/328, 108, 630, 607, 608
See application file for complete search history.

(56) References Cited

U.S. PATENT DOCUMENTS

| 3,829,741 | A | 8/1974 | Athey | |
|---|---|---|---|---|
| 5,457,608 | A | 10/1995 | Scholder et al. | |
| 6,305,870 | B1 * | 10/2001 | Mita et al. | 403/254 |
| 6,646,890 | B1 * | 11/2003 | Byers et al. | 361/802 |
| 6,752,276 | B2 | 6/2004 | Rumney | |
| 6,971,899 | B1 * | 12/2005 | Liu | 439/326 |
| 7,134,895 | B1 * | 11/2006 | Choy et al. | 439/326 |
| 7,182,618 | B1 * | 2/2007 | Choy et al. | 439/328 |
| 7,241,159 | B1 * | 7/2007 | Chen | 439/326 |
| 2009/0111296 | A1 | 4/2009 | Zhu | |
| 2009/0180264 | A1 * | 7/2009 | Chiang | 361/752 |

FOREIGN PATENT DOCUMENTS

JP 2007-141686 6/2007

OTHER PUBLICATIONS

"Extended European Search Report", mailed by EPO and corresponding to European application No. 09179062.6 on May 4, 2010.

* cited by examiner

*Primary Examiner* — Hung S Bui

(57) ABSTRACT

An attachment device includes a first holding member configured to be fixed to a board and engage a first end part of a device to be attached to the board to hold the first end part; a second holding member configured to be attached to the board and engage a second end part of the device to be attached to hold the second end part; and a positioning mechanism configured to adjust the attachment position of the second holding member relative to the board.

8 Claims, 14 Drawing Sheets

13A

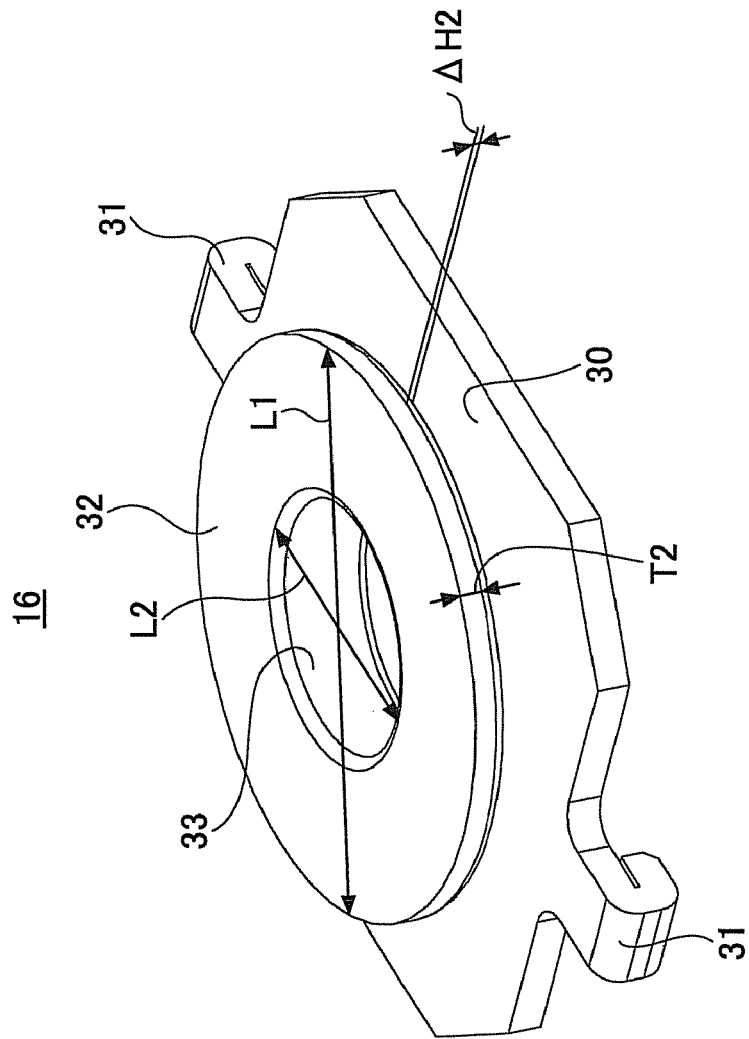
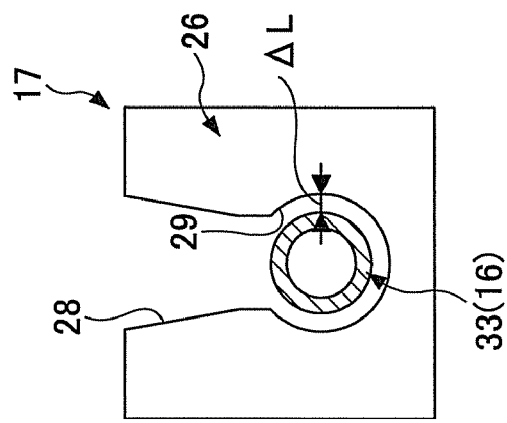

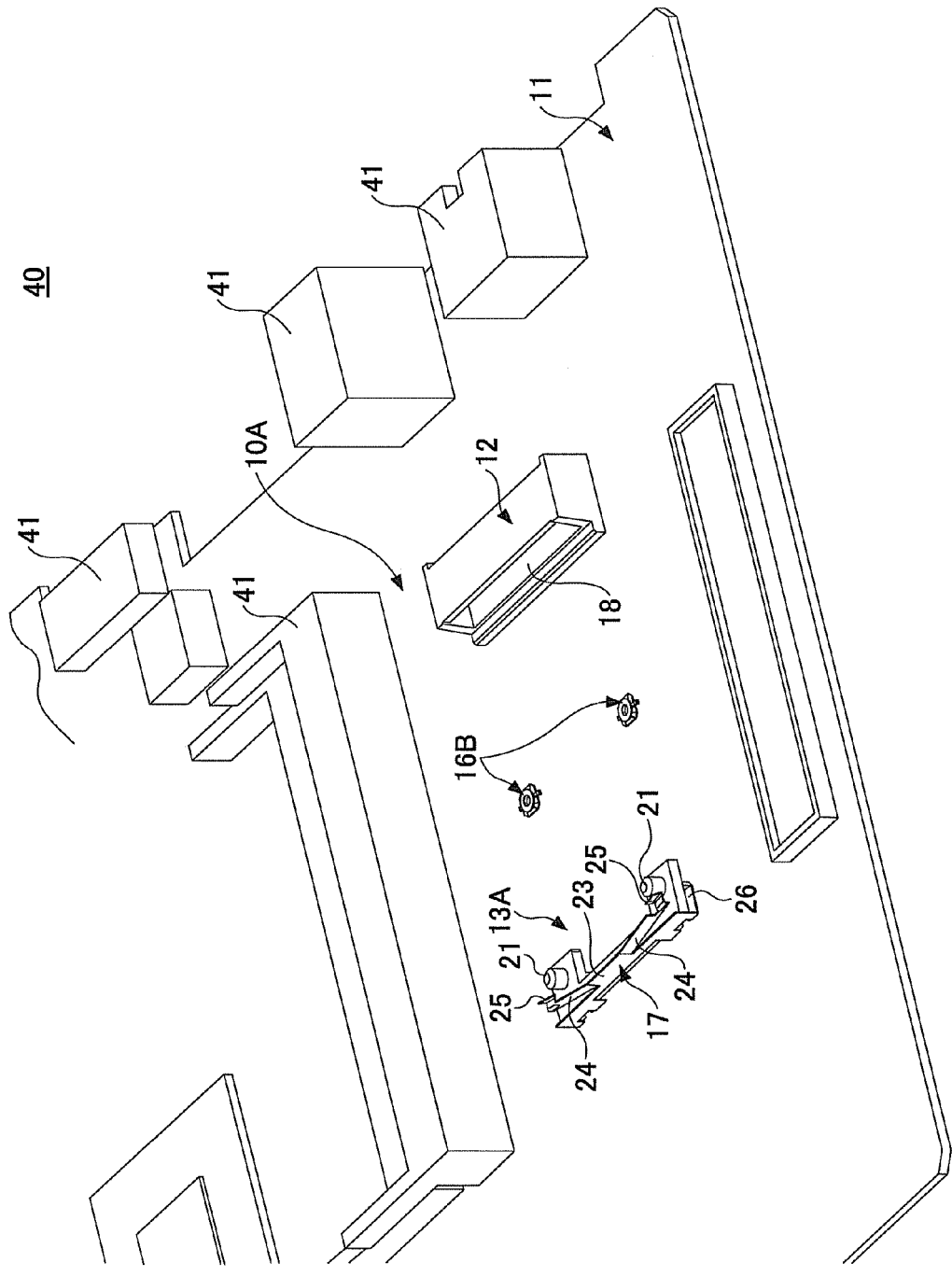

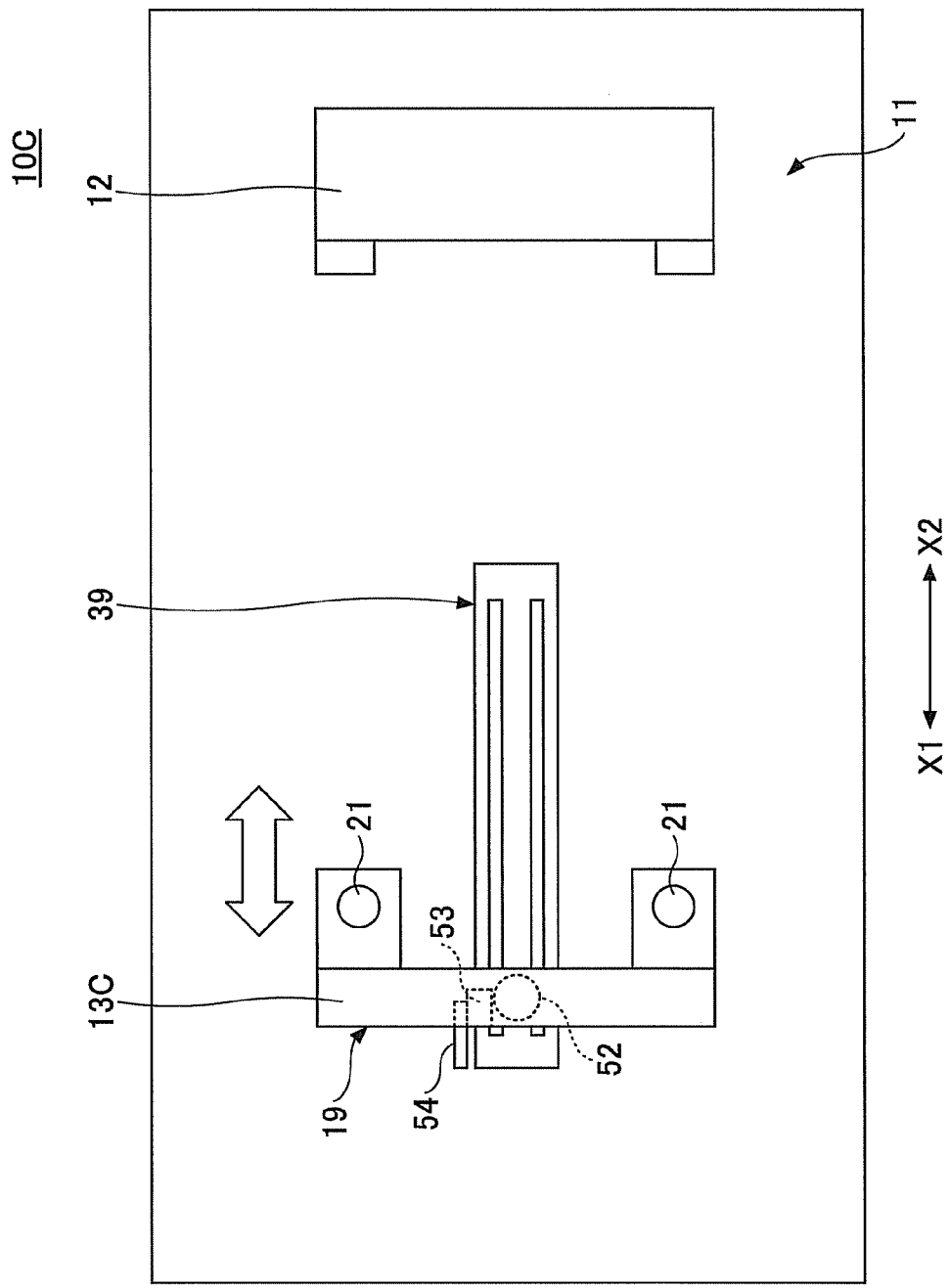

ATTACHMENT DEVICE AND ELECTRONIC APPARATUS

CROSS-REFERENCE TO RELATED APPLICATION

The present application is based upon and claims the benefit of priority of the prior Japanese Patent Application No. 2008-333593, filed on Dec. 26, 2008, the entire contents of which are incorporated herein by reference.

FIELD

A certain aspect of the embodiments discussed herein is related to an attachment device and an electronic apparatus.

BACKGROUND

Card-shaped electronic modules having electronic components such as an integrated circuit (IC) mounted on a board surface are commonly known as devices for expanding the functions of personal computers (PCs). Such electronic modules are attached to a board provided in a PC. Therefore, the board has an attachment device for attaching an electronic module. (See, for example, Japanese Laid-open Patent Publication No. 2007-141686.)

This attachment device includes a socket and a holding member (also referred to as a latch) fixed to the board. The socket includes a connector for electrical connection to an electronic module. The holding member includes lock pieces for engaging the electronic module.

The leading end of the electronic module is inserted into the socket to be held and electrically connected to the board. The trailing end of the electronic module is engaged with and held by the lock pieces of the holding member. Thereby, the electronic module is attached to the board through the attachment device.

SUMMARY

According to an aspect of the invention, an attachment device includes a first holding member configured to be fixed to a board and engage a first end part of a device to be attached to the board to hold the first end part; a second holding member configured to be attached to the board and engage a second end part of the device to be attached to hold the second end part; and a positioning mechanism configured to adjust an attachment position of the second holding member relative to the board.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWING(S)

FIG. 7A is an enlarged perspective view of a stud member according to the first embodiment;

FIG. 7B is a diagram illustrating a state where an engagement member engages the stud member according to the first embodiment;

FIG. 8 is a perspective view of an electronic apparatus to which the attachment device of the first embodiment is applied, illustrating a state before attachment of an electronic module;

FIG. 14 is a plan view of an attachment device according to a fourth embodiment.

DESCRIPTION OF EMBODIMENTS

Electronic modules are not uniform in the size of external shape, and electronic modules are provided that are different in the size of external shape because of their functional differences. The conventional attachment device as described above has both socket and holding member fixed to the board. That is, the positions of the socket and the holding member on the board are uniquely determined and are not changeable.

Thus, conventionally, in the case of attaching multiple kinds of electronic modules different in the size of external shape using the conventional attachment device, multiple attachment devices corresponding to the respective external shape sizes are provided on the board. However, this method necessitates multiple points for mounting electronic modules, thus preventing high-density mounting on the board. Further, all of the multiple electronic modules provided are not necessarily used. In this case, a dead space is created on the board, thus also preventing high-density mounting on the board.

Preferred embodiments of the present invention are explained below with reference to accompanying drawings.

[a] First Embodiment

FIG. 1, FIG. 2, FIG. 3, and FIG. 4 illustrate an attachment device 10A according to a first embodiment of the present invention. The attachment device 10A is used to attach card-shaped electronic modules used as devices for expanding the functions of a personal computer (PC) to a board 11 in the PC. Therefore, the attachment device 10A is provided on the board 11 in the PC.

As described above, such electronic modules may not be uniform in the size of external shape, and electronic modules may be provided that are different in the size of external shape because of their functional differences. In the following description, by way of example, the attachment device 10A is configured to allow attachment of a first electronic module 45A and a second electronic module 45B, which is smaller in the size of external shape than the first electronic module 45A. In FIG. 1 through FIG. 4, the first electronic module 45A and the second electronic module 45B are indicated by two-dot chain lines. Hereinafter, the first electronic module 45A and the second electronic module 45B may also be referred to collectively as "electronic module 45."

Figure 9:
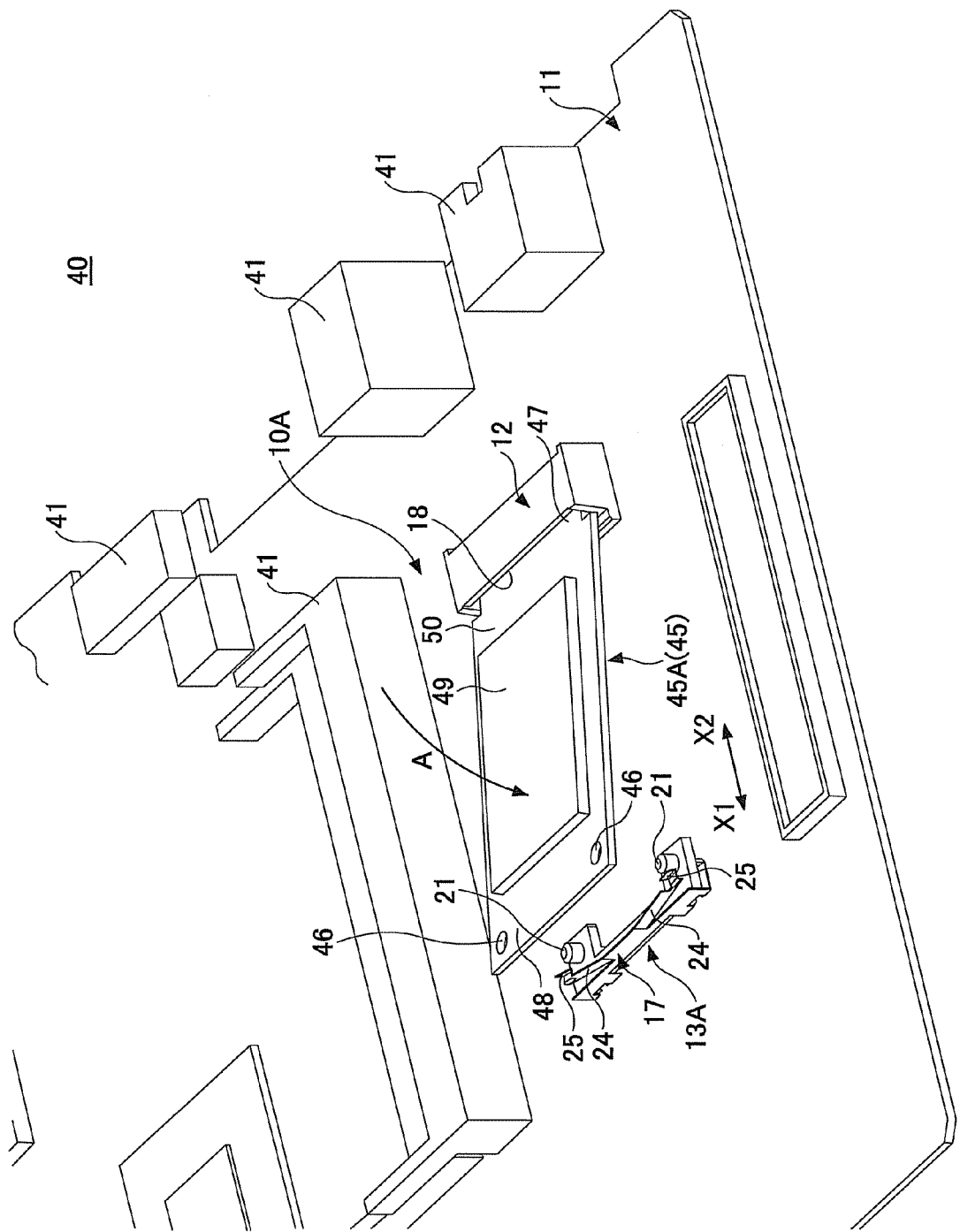
FIG. 9 is a perspective view of the electronic apparatus to which the attachment device of the first embodiment is applied, illustrating a state during attachment of the electronic module.
Figure 10:
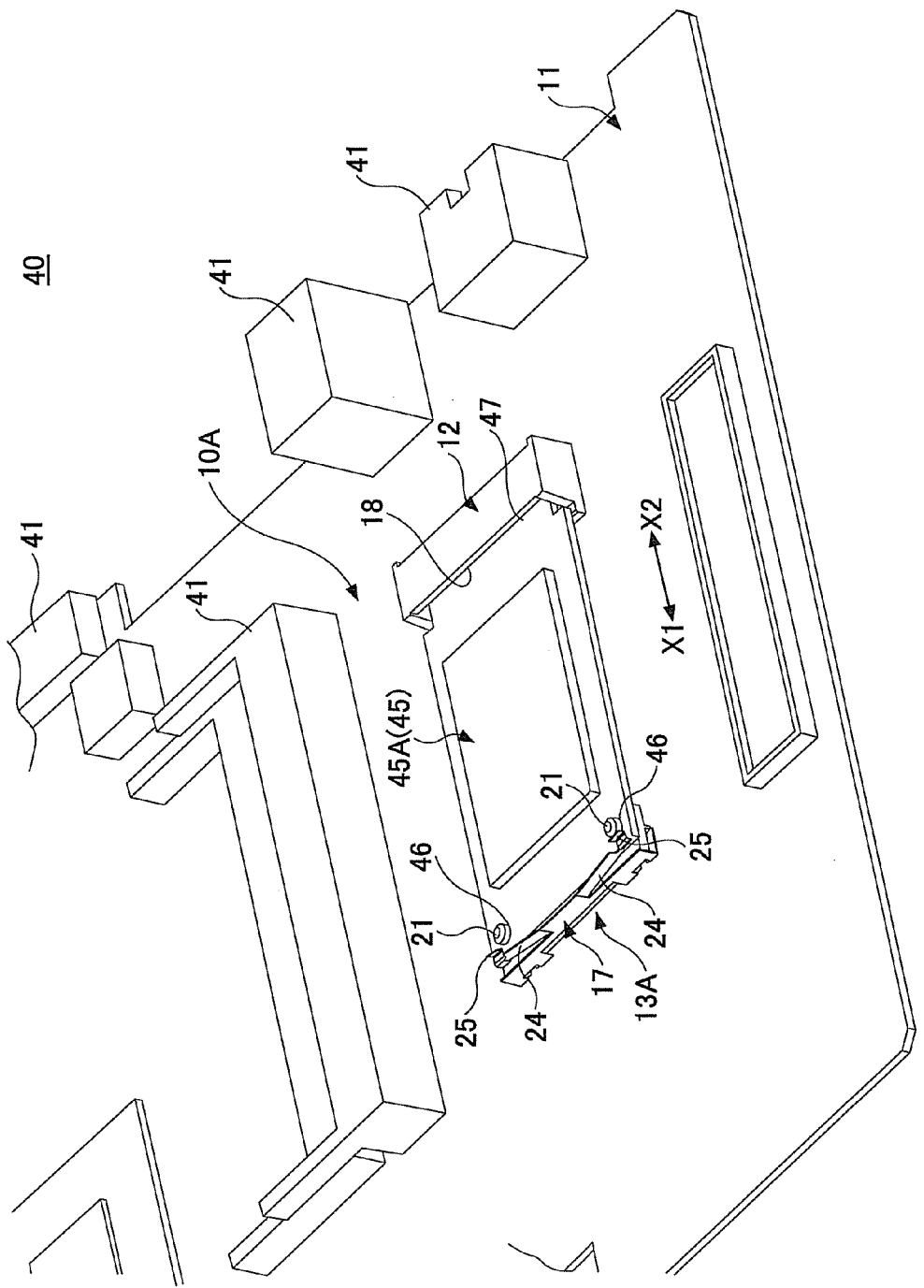
FIG. 10 is a perspective view of the electronic apparatus to which the attachment device of the first embodiment is applied, illustrating a state where the electronic module is attached.

The electronic module 45, which may be, for example, a memory module, includes a module board 50 and an integrated circuit (IC) 49 mounted on the surface of the module board 50. (See, for example, FIG. 9 and FIG. 10.) Referring to FIG. 9 and FIG. 10 as well as FIG. 1, the electronic module 45 has external connection terminals (not graphically illustrated) provided on a leading end part 47 of the module board 50 and has attachment holes 46 formed one on each side in a trailing end part 48 of the module board 50. Examples of the electronic module 45 include Mini PCI Express cards and small outline dual-in-line memory modules (SO-DIMMs).

Referring to FIG. 1 through FIG. 4, the attachment device 10A includes a socket 12 (a first holding member), a holding member 13A (a second holding member), and a positioning mechanism 15.

The socket 12 includes a socket body 12a molded from resin. An opening 18 into which the leading end part 47 of the electronic module 45 is inserted is formed in the socket body 12a. The opening 18 is provided on the side facing the holding member 13A. Further, a card edge connector (not graphically illustrated) to electrically connect to the external connection terminals provided on the electronic module 45 is provided in the bottom of the opening 18 of the socket body 12a. The card edge connector is electrically connected to interconnects (not graphically illustrated) provided on the board 11.

The leading end part 47 of the electronic module 45 is held by the socket 12 by being inserted into the opening 18. Further, when the leading end part 47 is inserted into the socket 12, the external connection terminals connect to the card edge connector inside the socket 12. As a result, the electronic module 45 is electrically connected to the board 11 through the socket 12.

The socket 12 is fixed to the board 11 by soldering. Therefore, the socket 12 is undisplaceable relative to the board 11.

Figure 5:
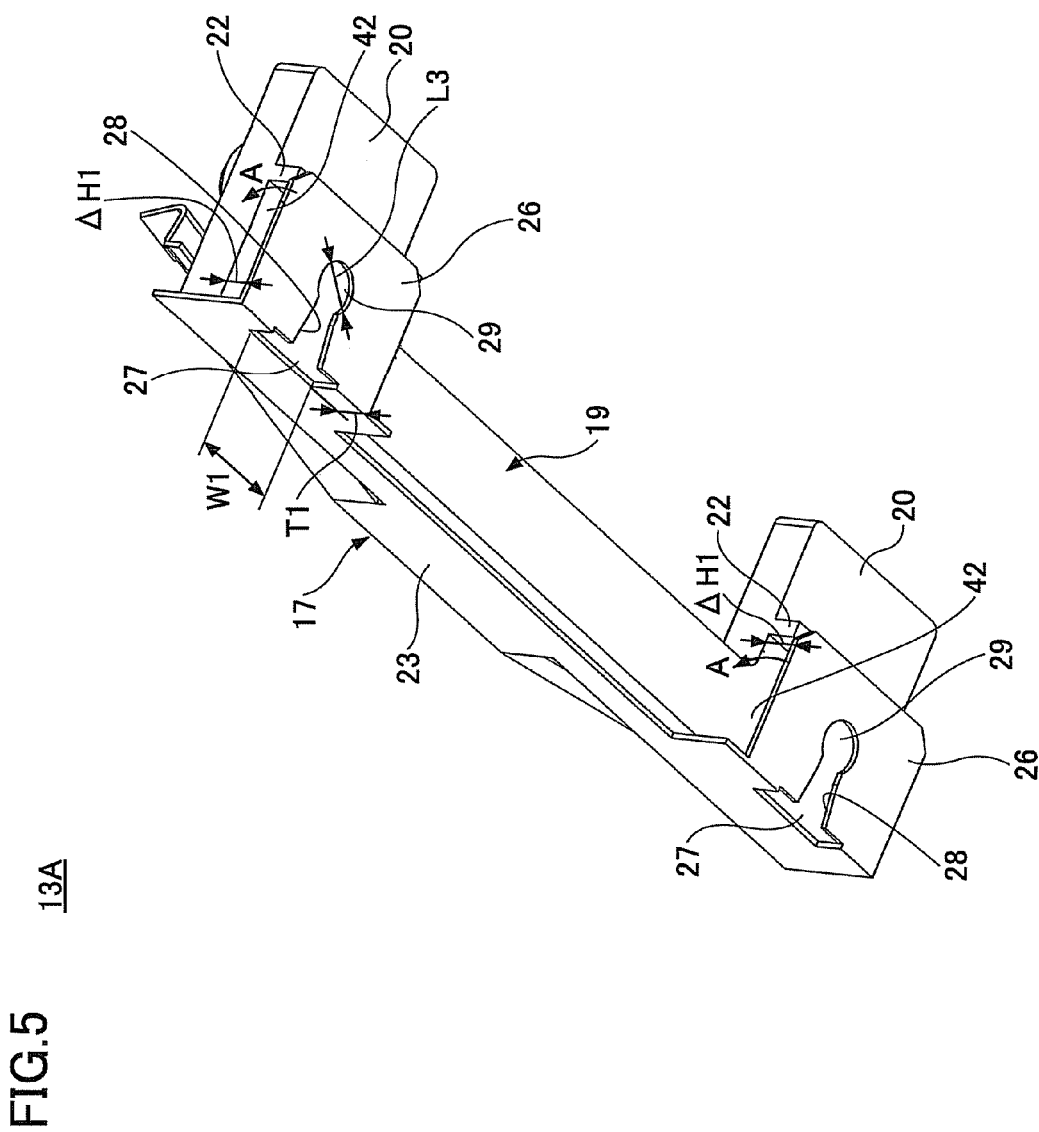
FIG. 5 is a bottom-side perspective view of the holding member according to the first embodiment.
Figure 6:
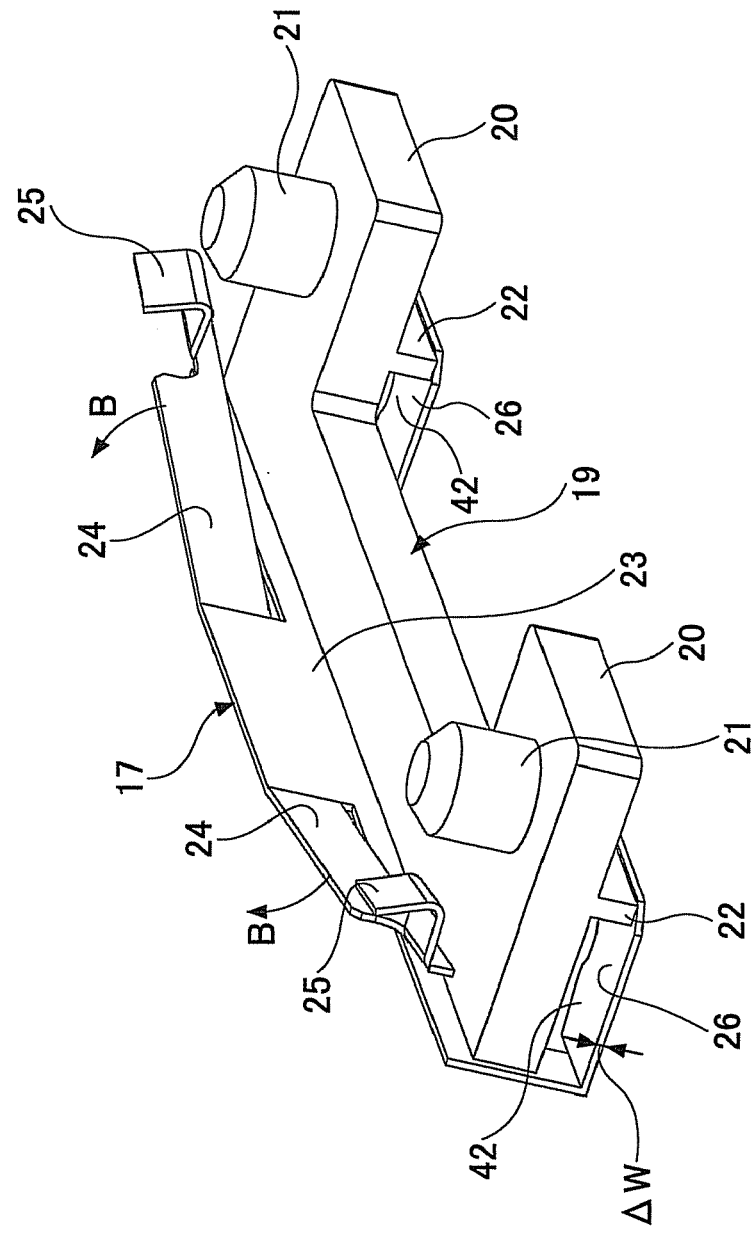
FIG. 6 is a top-side perspective view of the holding member according to the first embodiment.

FIG. 5 and FIG. 6 are enlarged views of the holding member 13A. FIG. 5 is a lower-side perspective view of the holding member 13A, and FIG. 6 is an upper-side perspective view of the holding member 13A.

Referring to FIG. 5 and FIG. 6, the holding member 13A, which may also be referred to as "latch," includes an engagement member 17 and a resin-formed part 19.

The resin-formed part 19, which is a unitary structure of resin, includes extension parts 20, projection parts 21, and leg parts 22. The extension parts 20 are formed to extend in a direction to face the socket 12 with the holding member 13A attached to the board 11. The extension parts 20 are provided one on each side (at each longitudinal end) of the resin-formed part 19 so that the resin-formed part 19 has a substantially angular C-letter shape in a plan view.

The projection parts 21 are formed at positions corresponding to the positions where the attachment holes 46 (FIG. 9 and FIG. 10) are formed in the trailing end part 48 of the electronic module 45. The projection parts 21 are formed to project upward from the corresponding extension parts 20. The end of each projection part 21 has a truncated cone shape for smooth engagement with (the corresponding attachment hole 46 of) the electronic module 45.

As illustrated in FIG. 10, with the electronic module 45 being attached to the holding member 13A, the attachment holes 46 formed in the trailing end part 48 of the module board 50 are engaged with the corresponding projection parts 21. Further, the trailing end part 48 is placed on the extension parts 20. Thereby, the electronic module 45 is held by the holding member 13A.

The leg parts 22 are formed to project downward from the lower surfaces of the extension parts 20. The leg parts 22 engage with (abut) corresponding engagement parts 26 (described below) of the engagement member 17. The engagement parts 26 are positioned and are prevented from deforming (in the direction indicated by arrow A in FIG. 5) by engaging with the corresponding leg parts 22.

Next, a description is given of the positioning mechanism. Referring to FIG. 1 through FIG. 4, the positioning mechanism 15 includes the engagement member 17, which forms part of the holding member 13A, and stud members 16A and 16B fixed to the board 11. The stud members 16A and 16B may be collectively referred to as "stud members 16."

Referring also to FIG. 5 and FIG. 6, the engagement member 17, which is formed by press-molding a metal material into a unitary structure, includes a fixation part 23, spring parts 24, claw parts 25, and the engagement parts 26. Examples of the material of the engagement member 17 include spring materials such as phosphor bronze (a Cu—Sn system copper alloy) and beryllium copper (a Cu—Be system copper alloy).

The fixation part 23 is fixed to the resin-formed part 19. The method of fixing the fixation part 23 to the resin-formed part 19 is not limited in particular. The fixation part 23 may be fixed to the resin-formed part 19 using various methods such as bonding and insert molding.

The spring parts 24 are positioned on the side of the upper surface (the surface on the side on which the electronic module 45 is attached) of the resin-formed part 19. Each spring part 24 has a cantilever shape, extending at an angle from the corresponding side of the fixation part 23 toward the corresponding projection part 21. The craw parts 25 are formed one at the end of each spring part 24.

The claw parts 25 engage with the trailing end part 48 of the module board 50 when the electronic module 45 is attached to the attachment device 10A. In this engagement, the claw parts 25 are urged toward the trailing end part 48 of the module board 50, and the spring parts 24 elastically deform in the corresponding directions indicated by arrows B in FIG. 6. The elastic deformation of the spring parts 24 generates elastic restoring forces in the respective spring parts 24, and the elastic restoring forces urge the electronic module 45 toward the socket 12. As a result, the projection parts 21 are relatively pressed against the inside edges of the corresponding attachment holes 46 formed in the trailing end part 48 of the module board 50. This ensures attachment of the electronic module 45 to the attachment device 10A without backlash. An inclined surface is formed in each claw part 25 for smooth attachment of the electronic module 45.

The engagement parts 26 are at right angles to the fixation part 23 so as to face the bottom surfaces of the extension parts 20. As illustrated in FIG. 5, a space 42 having a height $\Delta H1$ is formed between each engagement part 26 and the bottom surface of the corresponding extension part 20. The height $\Delta H1$ of the spaces 42 is slightly greater than the below-described thickness T2 of a disk-shaped stud part 32 (FIG. 7A) of each stud member 16.

As illustrated in FIG. 5, a guide groove 28 and an engagement hole 29 are formed in each engagement part 26. Further, an insertion groove 27 is formed at each of the positions where the fixation part 23 is in contact with the engagement parts 26. Since the engagement member 17 is a unitary structure including the spring parts 24 and the engagement parts 26, it is possible to reduce the number of components and increase the assemblability of the holding member 13 compared with the case of forming the spring parts 24 and the engagement parts 26 separately.

The holding member 13A is attached to the stud members 16 through the insertion grooves 27, the guide grooves 28, and the engagement holes 29, which are described below after description of the stud members 16.

FIG. 7A is an enlarged view of the stud member 16 (any of the stud members 16). The stud member 16, which is formed of a metal material, includes a base part 30, fixation parts (fixation pieces) 31, the disk-shaped (annular) stud part 32, and a pillar part 33. Examples of the material of the stud member 16 include spring materials such as phosphor bronze (a Cu—Sn system copper alloy) and beryllium copper (a Cu—Be system copper alloy), the same as in the case of the engagement member 17.

The base part 30 has a flat plate shape. According to this embodiment, the two fixation parts 31 are formed one at each end of the base part 30. Since the stud member 16 is fixed to the board 11 according to this embodiment, the fixation parts 31 for fixing the stud member 16 to the board 11 are formed on the base part 30. The fixation parts 31 have a lead shape.

The fixation parts 31 may be fixed to the board 11 by soldering the fixation parts 31 to corresponding pads formed on the board 11. Alternatively, the fixation parts 31 may be fixed to the board 11 by inserting the fixation parts 31 into corresponding attachment holes formed in the board 11, and caulking portions of the fixation parts 31 projecting from the board 11.

The pillar part 33 is provided in the center position of the base part 30 in a standing manner. Further, the disk-shaped stud part 32 is provided at the upper end of the pillar part 33. Accordingly, the disk-shaped stud part 32 is supported over the base part 30 by the pillar part 33. The disk-shaped stud part 32 is displaceable, although slightly, with respect to the pillar part 33.

The diameter L1 of the disk-shaped stud part 32 is greater than the outside diameter L2 of the pillar part 33. Further, the distance ΔH2 between the upper surface of the base part 30 and the lower surface of the disk-shaped stud part 32 is equal to or slightly greater than the plate thickness ΔW (indicated by arrows in FIG. 6) of the engagement member 17 (ΔH2 ΔW).

Next, a description is given of attaching the holding member 13A to the stud members 16.

The holding member 13A is attached to the stud members 16 by inserting the disk-shaped stud parts 32 of the stud members 16 into the corresponding insertion grooves 27 and engaging the pillar parts 33 with the corresponding engagement parts 26. Thus, the holding member 13A is attached to the stud members 16 by this simple operation. Further, the holding member 13A is also attached to the board 11 by being attached to the stud members 16.

According to this embodiment, in the attachment of the holding member 13A to the stud members 16, the holding member 13A is attached from the side of the area where the electronic module 45 is attached (the attachment area of the electronic module 45). That is, the holding member 13A is attached to the stud members 16 by being moved and urged in the direction indicated by arrow X1 in FIG. 1 and FIG. 4, and is removed (detached) from the stud members 16 by being moved and urged in the direction indicated by arrow X2 in FIG. 1 and FIG. 4.

Here, it is assumed for comparison purposes that the holding member 13A is attached to the stud members 16 by being moved and urged in the direction opposite to the above-described direction. In this case, it is necessary to separately provide an area for attaching and detaching the holding member 13A (an attachment and detachment area for the holding member 13A) outside the attachment area of the electronic module 45. According to this embodiment, however, since the direction in which the holding member 13A is attached to the stud members 16 is determined as described above, there is no need to provide the attachment and detachment area outside the attachment area of the electronic module 45, so that it is possible to improve efficiency in mounting a device to be attached on the board 11.

When the holding member 13A is attached to the stud members 16, the disk-shaped stud parts 32 of the stud members 16 are inserted into the corresponding spaces 42 through the insertion grooves 27 formed in the engagement member 17. With this insertion, the pillar parts 33, which support the disk-shaped stud parts 32 over the base parts 30, pass through the guide grooves 28 to engage with the corresponding engagement holes 29.

Here, a description is given, referring back to FIG. 5, of the insertion grooves 27, the guide grooves 28, and the engagement holes 29 formed in the engagement member 17.

The width (horizontal dimension) W1 of the insertion grooves 27 is greater than the diameter L1 (FIG. 7A) of the disk-shaped stud parts 32 (W1>L1). Further, the height (vertical dimension) T1 of the insertion grooves 27 is greater than the width (thickness) T2 (FIG. 7A) of the disk-shaped stud parts 32 (T1>T2). Further, as described above, the distance ΔH2 (FIG. 7A) between the base part 30 and the disk-shaped stud parts 32 is equal to or slightly greater than the plate thickness ΔW of the engagement member 17 (ΔH2≧ΔW). Further, the guide groove 28 has a shape flaring from the engagement hole 29 toward the insertion groove 27, so that the width of the guide groove 28 at the insertion groove 27 is sufficiently greater than (for example, half as much again as) the outside diameter L2 of the pillar part 33.

Therefore, when the holding member 13A is attached to the stud members 16, the disk-shaped stud parts 32 are smoothly inserted into the corresponding insertion grooves 27, and the pillar parts 33 are guided by the guide grooves 28 to be smoothly attached to the corresponding engagement holes 29. Accordingly, the holding member 13A is attached to the stud members 16 in a simple manner.

As described above, with the holding member 13A attached to the stud members 16, each engagement part 26 is held between the base part 30 and the disk-shaped stud part 32 of the corresponding stud member 16. Further, the pillar parts 33 are engaged with the corresponding engagement holes 29.

FIG. 7B is a diagram for illustrating the relationship between the pillar part 33 (illustrated in a cross section) and the corresponding engagement hole 29 when the holding member 13A is attached to the stud members 16. Referring to FIG. 7B, the outside diameter (L2 in FIG. 7A) of the pillar part 33 is smaller than the diameter (L3 in FIG. 5) of the engagement hole 29, so that there is a gap ΔL (indicated by arrows) formed between the pillar part 33 and the inside edge of the engagement hole 29. This gap ΔL, which may differ depending on the specifications of the attachment device 10A and may not be uniquely determined, may be, for example, approximately 0.1 mm to approximately 0.2 mm.

The size (value) of the gap ΔL is greater than the sum of various kinds of errors such as the manufacturing error of the socket 12, error in the attachment of the socket 12 to the board 11, the manufacturing error of the stud members 16, error in the attachment of the stud members 16 to the board 11, and the manufacturing error of the holding member 13A. Accordingly, the pillar part 33 is displaceable within the range of the gap ΔL in the engagement hole 29.

Figure 1:
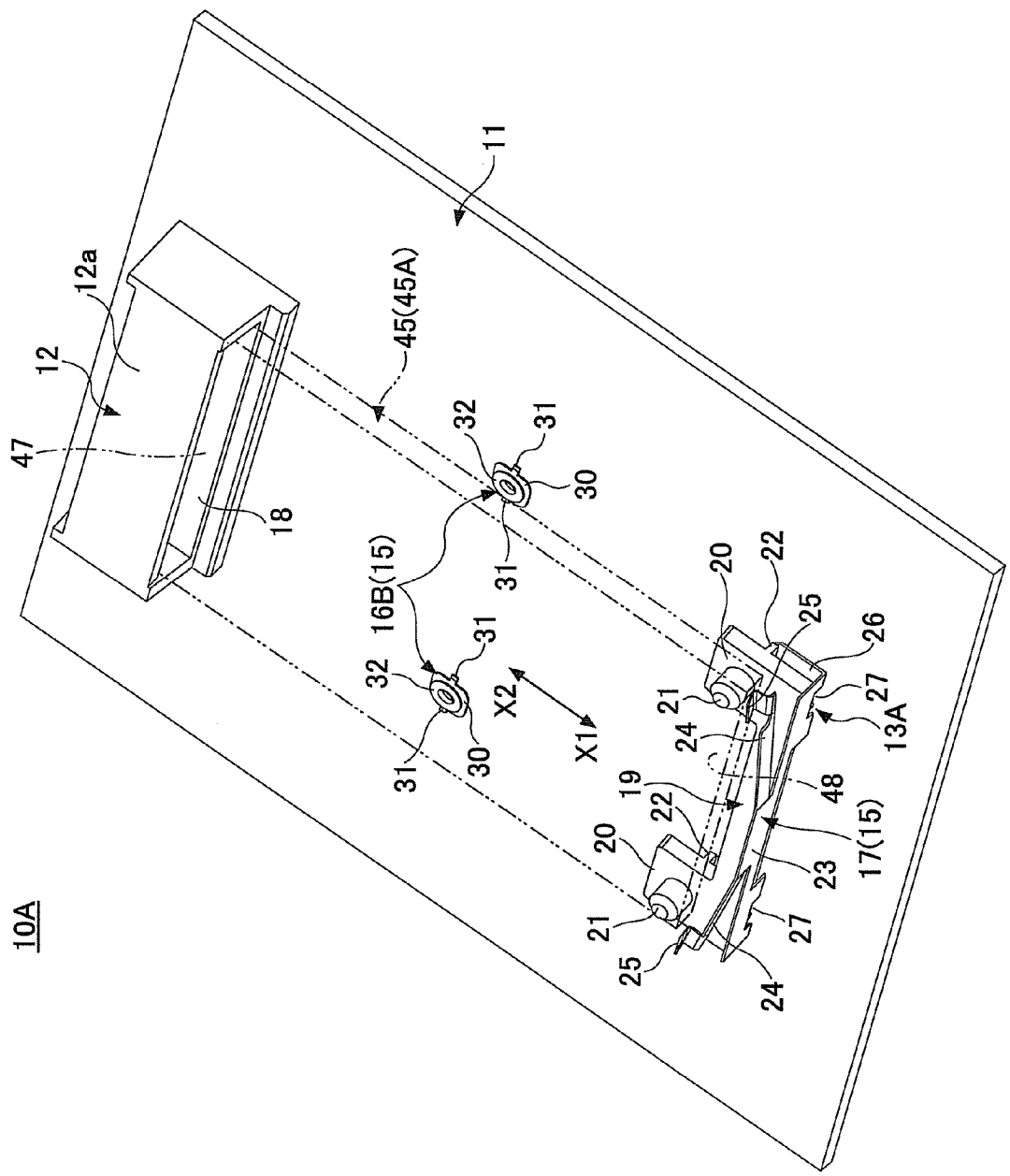
FIG. 1 is a perspective view of an attachment device according to a first embodiment, illustrating a state where a holding member is attached to a first position.
Figure 2:
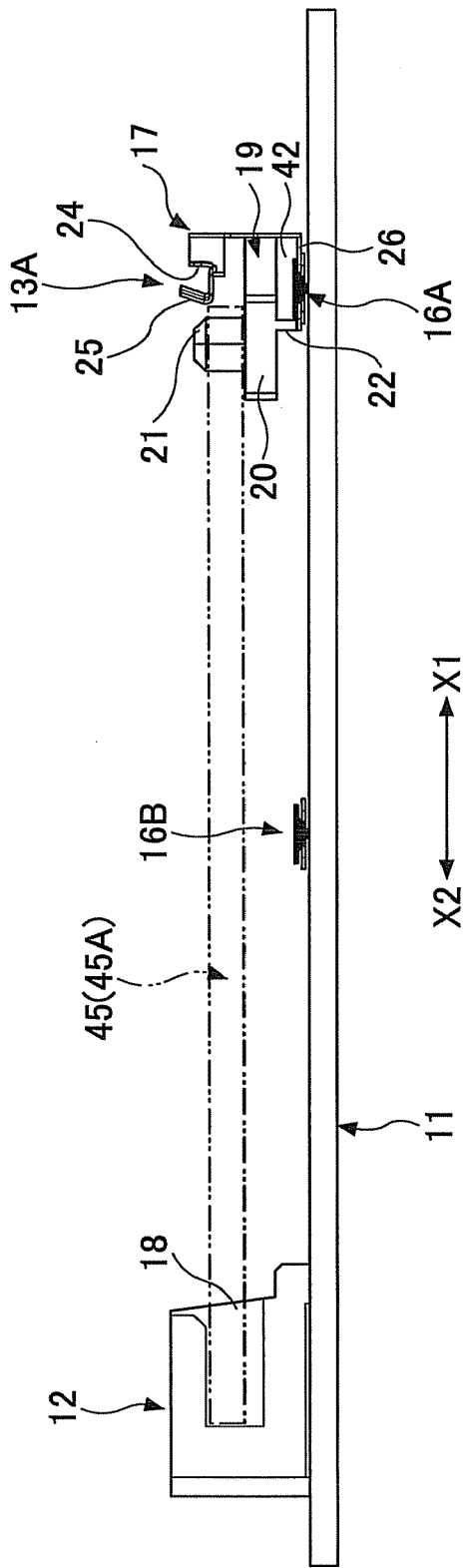
FIG. 2 is a front view of the attachment device according to the first embodiment, illustrating the state where the holding member is attached to the first position.
Figure 3:
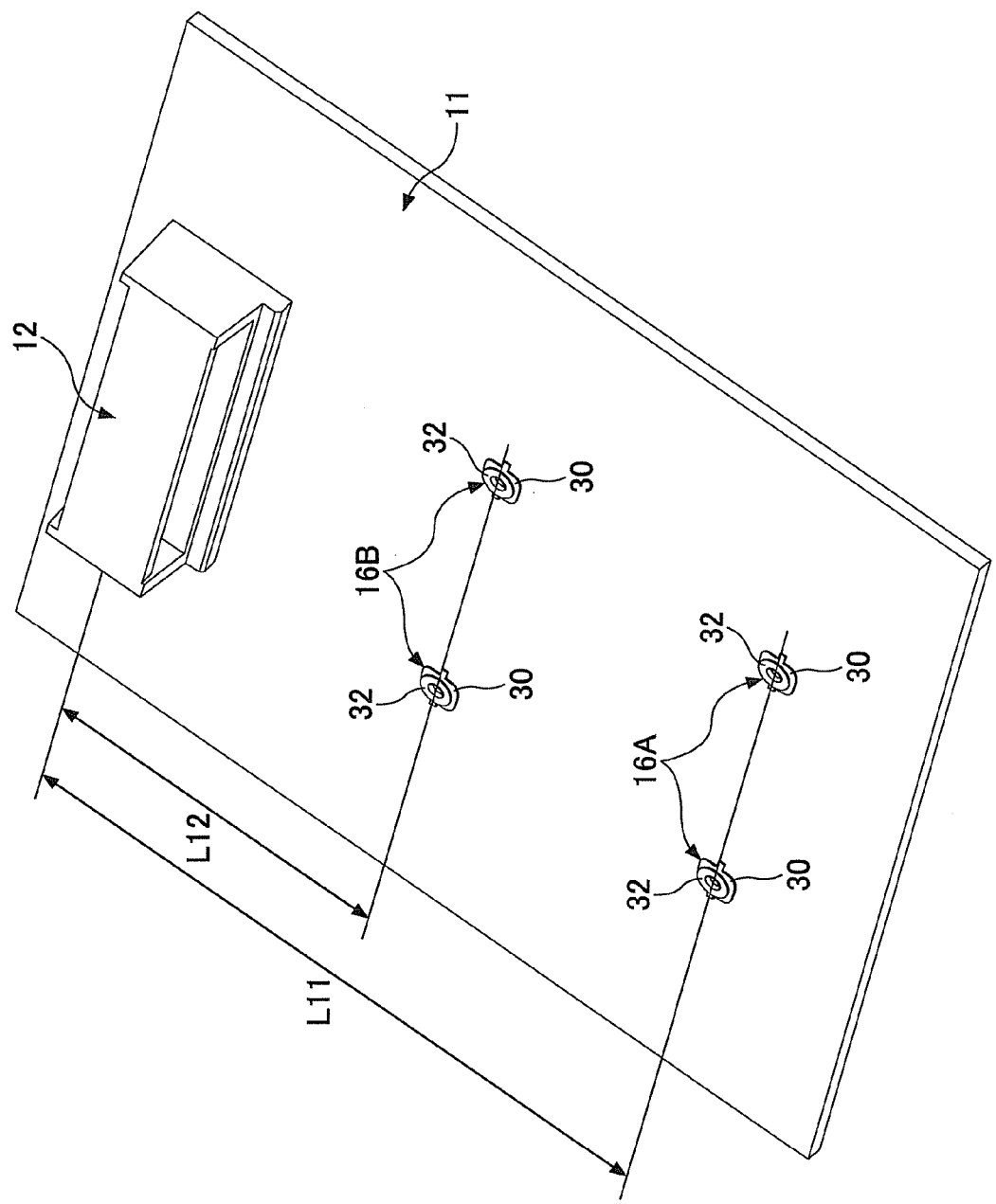
FIG. 3 is a perspective view of the attachment device without the holding member according to the first embodiment.

Next, a description is given of positions where the stud members 16 configured as described above are provided on the board 11. FIG. 3 illustrates the board 11 without the holding member 13A, which is a constituent element of the attachment device 10A. As illustrated in FIG. 3, according to this embodiment, the stud members 16A (a first pair of stud members) are fixed at corresponding positions a distance L11 apart from the installation position of the socket 12, and the stud members 16B (a second pair of stud members) are fixed at corresponding positions a distance L12 apart from the installation position of the socket 12.

The attachment device 10A according to this embodiment is configured to allow attachment of the first electronic module 45A and the second electronic module 45B, which is smaller in outside dimensions than the first electronic module 45A. The stud members 16A are provided at positions corresponding to the first electronic module 45A, and the stud members 16B are provided at positions corresponding to the second electronic module 45B.

Figure 4:
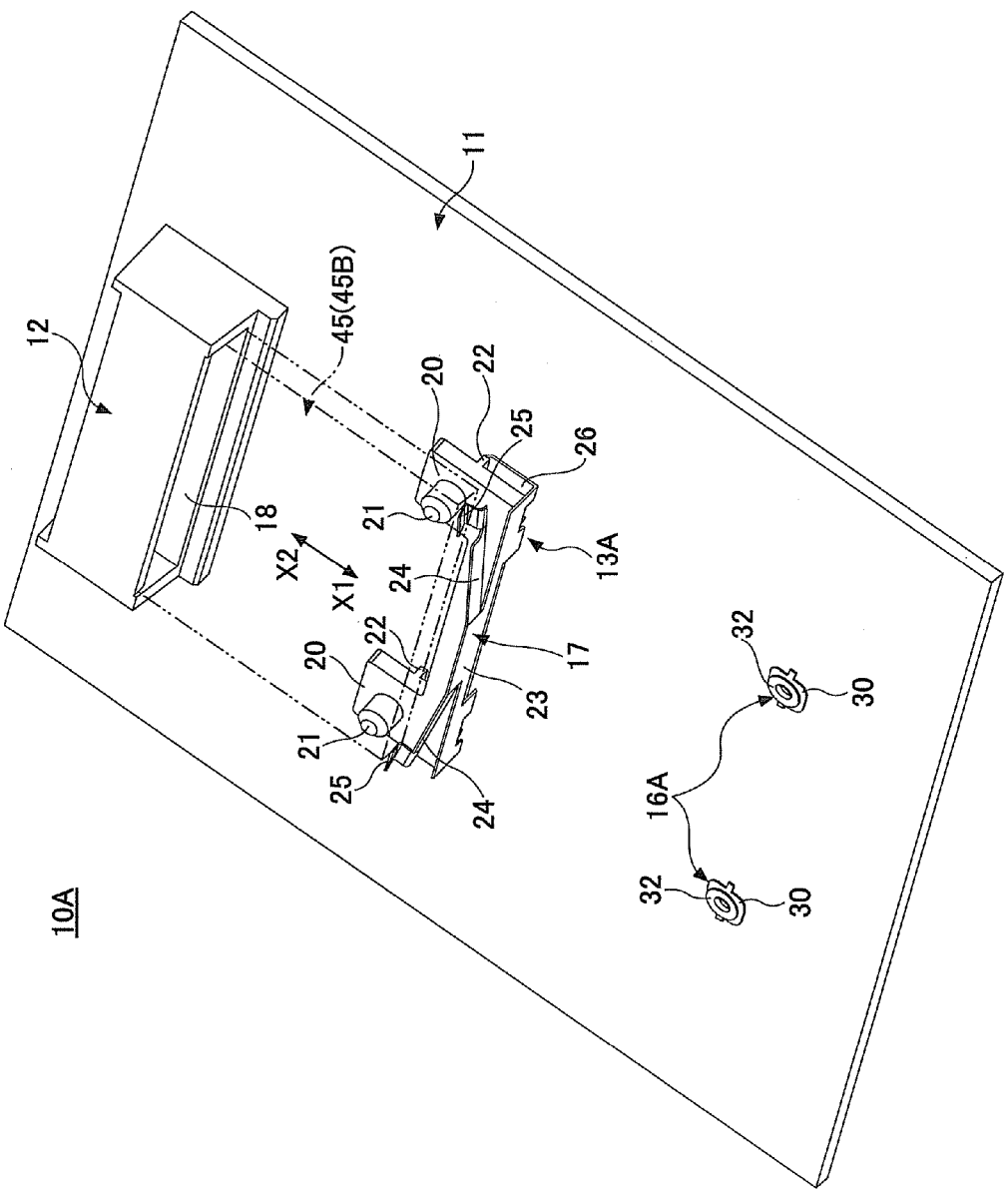
FIG. 4 is a perspective view of the attachment device according to the first embodiment, illustrating a state where the holding member is attached to a second position.

That is, attaching the holding member 13A to the stud members 16A allows the electronic module 45A to be attached between the socket 12 and the holding member 13A, and attaching the holding member 13A to the stud members 16B allows the electronic module 45B to be attached between the socket 12 and the holding member 13A. FIG. 4 illustrates a state where the holding member 13A is attached to the stud members 16B.

Thus, the attachment position of the attachment device 10A according to this embodiment is determinable (adjustable) in accordance with the shape of the electronic module 45. Therefore, the attachment device 10A alone allows the electronic modules 45A and 45B having different shapes to be attached to the board 11. Accordingly, there is no need to provide separate attachment devices for the first electronic module 45A and the second electronic module 45B as in the conventional case, so that it is possible to improve efficiency in mounting a device to be attached on the board 11.

Next, a description is given, with reference to FIG. 8, FIG. 9, and FIG. 10, of a method of attaching the electronic module 45 to the attachment device 10A. FIG. 8 through FIG. 10 illustrate the board 11, which is provided inside an electronic apparatus 40 such as a PC. In this electronic apparatus 40, the electronic module 45 is attached to the board 11 as a device for expanding one or more functions of the electronic apparatus 40. Therefore, the board 11 has the attachment device 10A.

As illustrated in FIG. 8 through FIG. 10, in addition to the attachment device 10A, various electronic components 41 are provided on the board 11. According to this embodiment, as described above, the attachment device 10A allows the holding member 13A to be attached to and detached from the stud members 16 (the board 11) in the attachment area of the electronic module 45, and the electronic modules 45A and 45B having different shapes are selectively attachable to the board 11 with the attachment device 10A alone. Accordingly, the attachment device 10A allows the electronic components 41 to be closely arranged, thus making it possible to mount the electronic components 41 on the board 11 with increased density.

A description is given below of a method of attaching the electronic module 45A to the attachment device 10A where the holding member 13A is attached to the stud members 16A.

FIG. 8 illustrates the attachment device 10A, to which the first electronic module 45A is not attached. In order to attach the first electronic module 45A to this attachment device 10A, first, as illustrated in FIG. 9, the leading end part 47 (of the module substrate 50) of the first electronic module 45A is inserted from above into the opening 18 of the socket body 12a at an angle to the board 11.

Next, as indicated by arrow A in FIG. 9, the first electronic module 45A is rotationally moved on the position where the leading end part 47 and the socket 12 are engaged. As a result of this operation, the projection parts 21 of the holding member 13A engage the corresponding attachment holes 46 of the module board 50 as illustrated in FIG. 10. Further, the trailing end part 48 of the module board 50 is placed on the extension parts 20. (See FIG. 2.) Hereinafter, the state illustrated in FIG. 10, where the electronic module 45A (45) is attached to the attachment device 10A, may be referred to as "module attached state."

In the module attached state, the first electronic module 45A is substantially parallel to the board 11. Further, the external connection terminals provided at the leading end part 47 of the module board 50 are electrically connected to the card edge connector inside the socket 12. Further, the trailing end part 48 of the module board 50 is elastically urged toward the socket 12 (in the direction indicated by arrow X2 in FIG. 10) by the spring parts 24 through the claw parts 25.

Referring back to the engagement of the pillar part 33 and the corresponding engagement hole 29, as described above, the gap ΔL is formed between the pillar part 33 and the engagement hole 29. The size (value) of this gap ΔL is greater than the sum of the manufacturing and attachment errors of the socket 12, the holding member 13A, and the stud members 16. Accordingly, in the module attached state, the pillar part 33 is displaced within the range of the gap ΔL in the engagement hole 29, that is, the holding member 13A is displaced within the range of the gap ΔL relative to the stud members 16A, so as to absorb (compensate for) the manufacturing and attachment errors of the socket 12, the holding member 13A, and the stud members 16.

Here, it is assumed for comparison purposes that the holding member 13A is fixed to the stud members 16A and is undisplaceable. In this case, depending on the occurrence condition of error, the module attachment area may be so small as to prevent the first electronic module 45A from being attached to the attachment device 10A. On the other hand, depending on the occurrence condition of error, the module attachment area is too large to ensure the attachment of the first electronic module 45A to the attachment device 10A, so that the first electronic module 45A may be detached from the attachment device 10A.

According to the attachment device 10A of this embodiment, however, the manufacturing and attachment errors of the socket 12, the holding member 13A, and the stud members 16 are absorbed where the engagement holes 29 and the corresponding pillar parts 33 are engaged as described above. This facilitates and ensures the attachment of the first electronic module 45A to the attachment device 10A. Further, the first electronic module 45A is prevented from being detached from the attachment device 10A after the attachment. The above-described operations and effects are also achieved when the holding member 13A is attached to the stud members 16B.

[b] Second Embodiment

Figure 11:
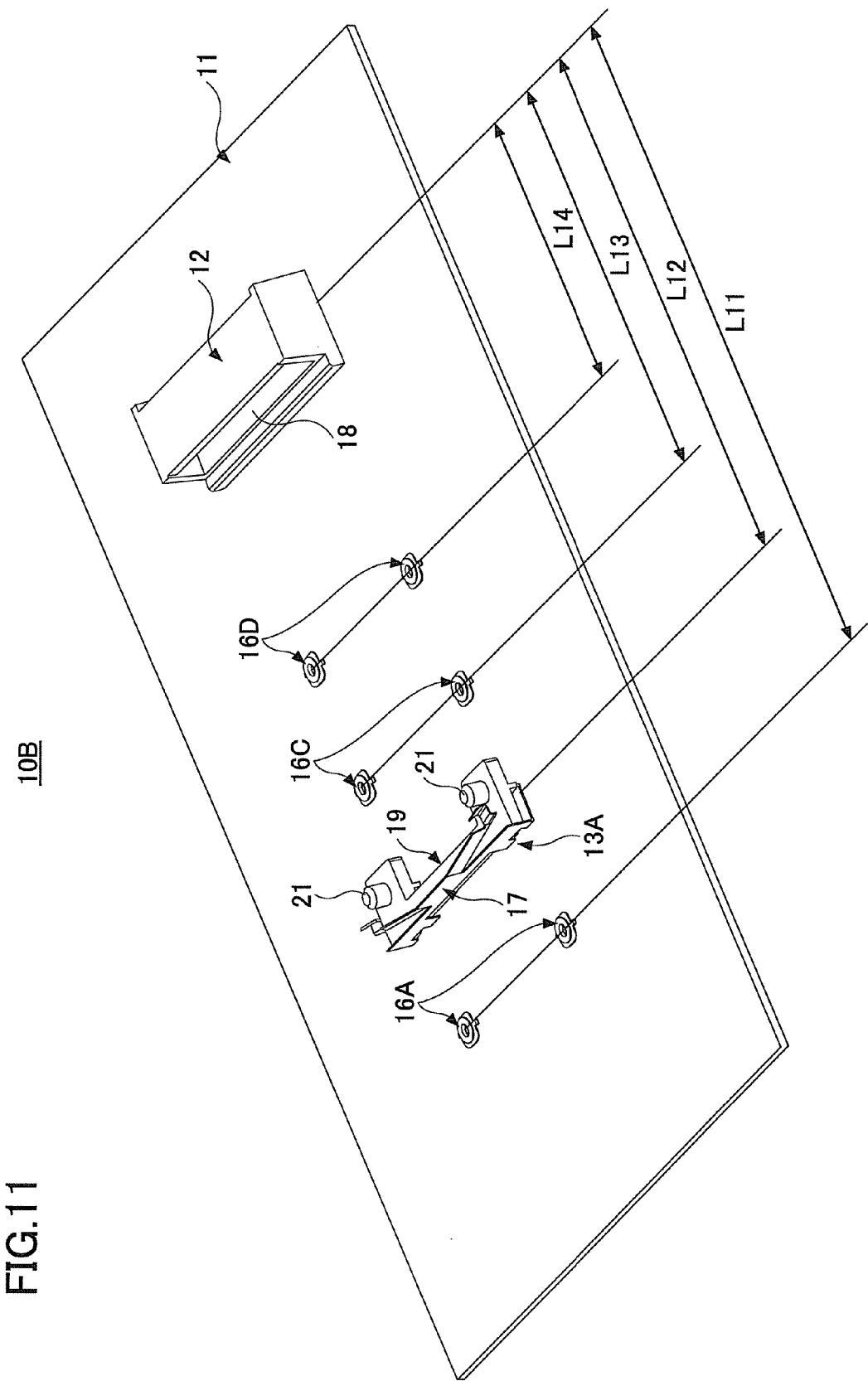
FIG. 11 is a perspective view of an attachment device according to a second embodiment.

Next, a description is given, with reference to FIG. 11, of a second embodiment of the present invention.

In FIG. 11, the same elements as illustrated above in FIG. 1 through FIG. 10 are referred to by the same reference numerals, and a description thereof is suitably omitted.

FIG. 11 illustrates an attachment device 10B according to the second embodiment.

The attachment device 10A according to the first embodiment allows two kinds of electronic modules having different shapes, that is, the first electronic module 45A and the second electronic module 45B, to be attached to the board 11. On the other hand, according to the attachment device 10B of the second embodiment, stud members are provided at multiple positions on the board 11 so as to support three or more kinds of electronic modules having different sizes. In the case illustrated in FIG. 11, the attachment device 10B is configured to allow attachment of the electronic modules 45 of four different sizes.

For example, the stud members 16A are provided at positions the distance L11 apart from the socket 12, the stud members 16B are provided at positions the distance L12 apart from the socket 12, stud members 16C are provided at positions a distance L13 apart from the socket 12, and stud members 16D are provided at positions a distance L14 apart from the socket 12. By thus suitably determining (selecting) the number of pairs and the installation positions of stud members 16 relative to the board 11, it is possible to attach electronic modules 45 of various shapes to the board 11.

[c] Third Embodiment

Figure 12:
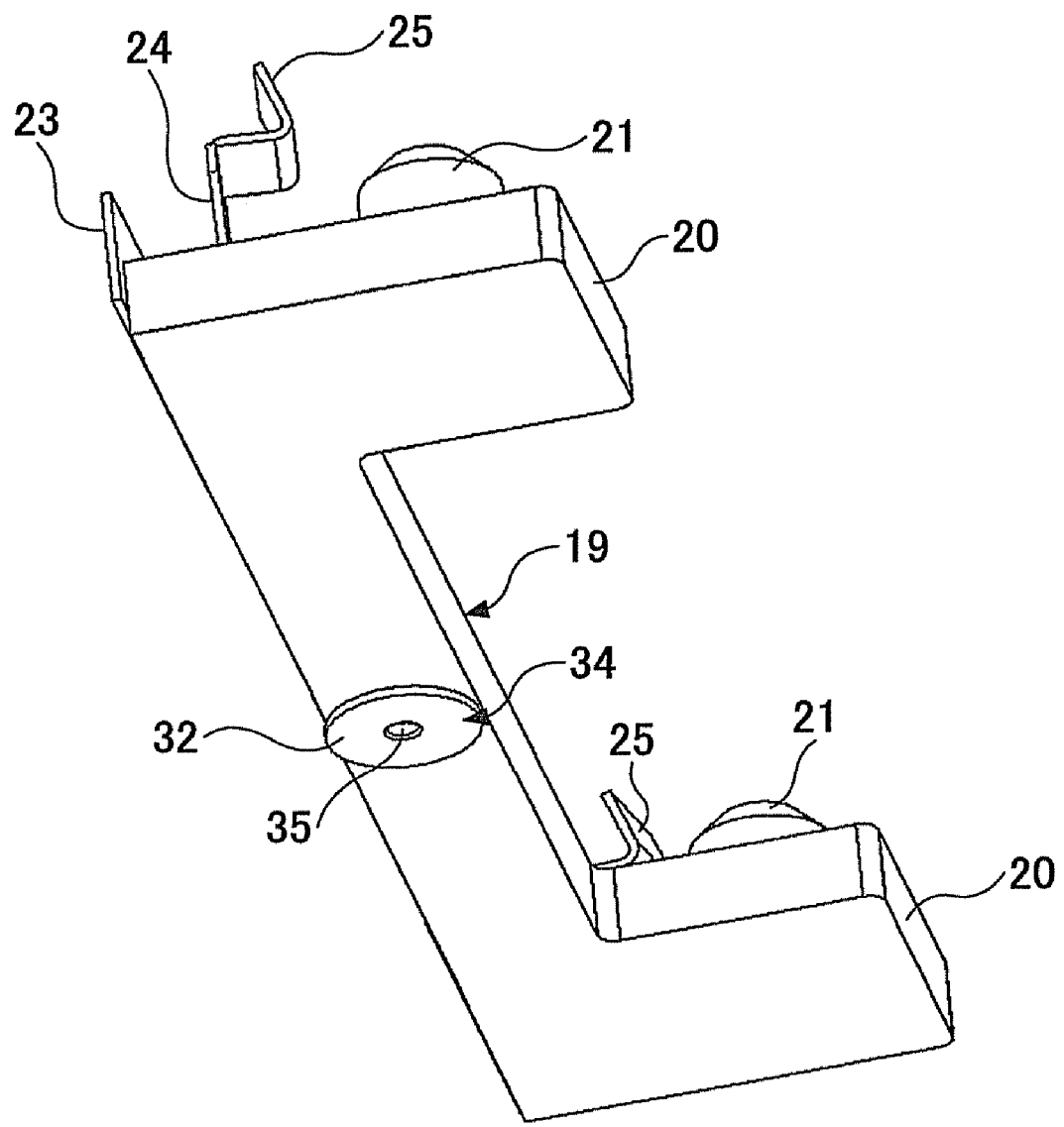
FIG. 12 is a bottom-side perspective view of a holding member used in an attachment device according to a third embodiment.
Figure 13:
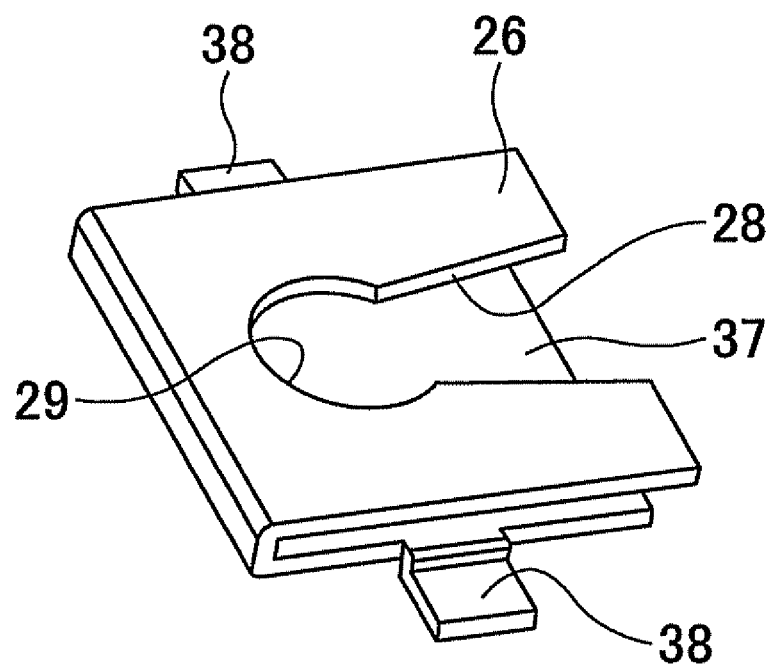
FIG. 13 is an enlarged view of an engagement member used in the attachment device according to the third embodiment.

FIG. 12 and FIG. 13 are diagrams for illustrating an attachment device according to a third embodiment of the present invention. FIG. 12 illustrates a holding member 13B of the attachment device according to the third embodiment. FIG. 13 illustrates an engagement member 36 of the attachment device according to the third embodiment. In FIG. 12 and FIG. 13, the same elements as those illustrated in FIG. 1 through FIG. 10 are referred to by the same reference numerals, and a description thereof is suitably omitted.

According to the attachment device 10A of the first embodiment, the stud members 16 are provided on the board 11 and the holding member 13A is provided with the engagement member 17. On the other hand, according to the attachment device of this embodiment, the holding member 13B is provided with a single stud member 34, and the engagement member 36 is provided on the board 11.

Referring to FIG. 12, the single stud member 34 is provided at the center position of the bottom surface of the resin-formed part 19. The stud member 34 includes a pillar part 35 provided on the bottom surface of the resin-formed part 19 in a standing manner, and the disk-shaped stud part 32 provided at the end of the pillar part 35.

Further, referring to FIG. 13, the engagement member 36 includes the engagement part 26 and a base part 37. The engagement part 26 and the base part 37 are formed by bending a single plate material. A lead-shaped fixation piece 38 is formed on each side part of the base part 37 positioned on the lower side. The fixation pieces 38 are fixed to the board 11 by soldering or caulking. Thereby, the engagement member 36 is fixed to the board 11. Further, the guide groove 28 and the engagement hole 29 are formed in the engagement part 26 positioned above the base part 37.

As is clear from the above descriptions of the first embodiment and the second embodiment, the installation position of the engagement member is not limited to one of the holding member and the board. Likewise, the installation position of the stud member is not limited to one of the holding member and the board.

That is, in the case of providing the holding member 13A with the engagement member 17 as in the first embodiment, the stud members 16 may be provided on the board 11. On the other hand, in the case of providing the holding member 13B with the stud member 34 as in this embodiment, the engagement member 36 may be provided on the board 11. This selection may be suitably made based on the design layout of the board 11 to which the attachment device is attached.

[d] Fourth Embodiment

FIG. 14 is a diagram for illustrating an attachment device 10C according to a fourth embodiment of the present invention. In FIG. 14, the same elements as those illustrated in FIG. 1 through FIG. 10 are referred to by the same reference numerals, and a description thereof is suitably omitted.

The attachment device 10C according to this embodiment includes a rail part 39 and a rail engagement part 52 that engages this rail part 39. The rail part 39 is provided on the board 11 so as to extend in the directions (X1 and X2 directions) in which the socket 12 and a holding member 13C face each other. The rail engagement part 52 is provided on the bottom surface of the holding member 13C so as to engage the rail part 39 in a slidable manner.

A lock mechanism 53 that restricts the movement of the rail engagement member 52 relative to the rail part 39 is provided near the rail engagement part 52. The lock mechanism 53 includes an operations lever 54. The operations lever 54 is operated to lock the rail engagement part 52 with the lock mechanism 53 or unlock the rail engagement part 52 locked by the lock mechanism 53.

In attaching the electronic module 45 to this attachment device 10C, first, an operator operates the operations lever 54 to unlock the rail engagement part 52 locked by the lock mechanism 53. Then, the leading end part 47 of the electronic module 45 is inserted into the socket 12, and the electronic module 45 is rotationally moved toward the holding member 13C. At this point, the holding member 13C is caused to slide on the rail part 39 to be positioned where the attachment holes 46 formed in the module board 50 (FIG. 9) engage the corresponding projection parts 21. When the holding member 13C is positioned, the operator operates the operations lever 54 to lock the rail engagement part 52 to the rail part 39 with the lock mechanism 53.

Thus, according to the attachment device 10C of this embodiment, the holding member 13C may be fixed at any position on the rail part 39 in a non-stepwise manner. Accordingly, it is possible to support electronic modules of various shapes with latitude.

Thus, according to an aspect of the present invention, it is possible to attach a device to be attached to a board irrespective of the shape of the device to be attached.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

For example, in the above-described embodiments, the socket 12 is fixed to the board 11. Alternatively, a positioning mechanism may be provided that allows adjustment of the position where the socket 12 is attached to the board 11.

Further, in the above-described embodiments, the card-shaped electronic module 45 is described as an example of the device to be attached. However, the device to be attached is not limited to the electronic module 45. For example, the above-described embodiments may also be applied in attaching an electronic apparatus such as a magnetic disk unit or an optical disk unit to a board.

What is claimed is:

1. An attachment device, comprising:
   a first holding member configured to be fixed to a board and engage a first end part of a device to be attached to the board to hold the first end part, the first holding member being configured to electrically connect the device and the board;
   a second holding member configured to be attached to the board and engage a second end part of the device to be attached to hold the second end part, the second end part being opposite to the first end part; and
   a positioning mechanism configured to adjust a position of an attachment of the second holding member to the board with respect to a position of the first holding member,
   the positioning mechanism including
      a stud member configured to be fixed to either the board or the second holding member; and
      an engagement member provided on the other of the board or the second holding member and configured to engage the stud member.

2. The attachment device as claimed in claim 1, wherein:
   the second holding member is provided with the engagement member, and
   the stud member is provided at a plurality of positions on the board, the positions corresponding to a size of the device to be attached.

3. The attachment device as claimed in claim 1, wherein:
   the second holding member is provided with the stud member, and
   the engagement member is provided at a plurality of positions on the board, the positions corresponding to a size of the device to be attached.

4. The attachment device as claimed in claim 1, wherein:
   the stud member includes
      a disk-shaped stud part; and
      a pillar part provided on the disk-shaped stud part in a standing manner, and
   the engagement member includes
      an engagement part configured to engage the stud member.

5. The attachment device as claimed in claim 4, wherein:
   the engagement part includes
      a guide groove configured to guide insertion of the pillar part; and
      an engagement hole configured to engage the pillar part.

6. The attachment device as claimed in claim 5, wherein:
   a gap greater than manufacturing errors of the first holding member and the second holding member is formed between the pillar part and the engagement hole.

7. The attachment device as claimed in claim 1, wherein:
   the positioning mechanism includes
      a rail part provided on the board to extend in directions in which the first holding member and the second holding member face each other; and
   an engagement part provided on the second holding member to engage the rail part in a slidable manner.

8. An electronic apparatus, comprising:
   an apparatus body;
   a board provided in the apparatus body; and
   the attachment device as set forth in claim 1 provided on the board.

* * * * *